United States Patent
Lear

(10) Patent No.: US 9,232,592 B2
(45) Date of Patent: Jan. 5, 2016

(54) ADDRESSABLE ILLUMINATOR WITH EYE-SAFETY CIRCUITRY

(71) Applicant: Trilumina Corporation, Albuquerque, NM (US)

(72) Inventor: Kevin L. Lear, Fort Collins, CO (US)

(73) Assignee: TRILUMINA CORP., Albuquerque, NM (US)

( * ) Notice: Subject to any disclaimer, the term of this patent is extended or adjusted under 35 U.S.C. 154(b) by 323 days.

(21) Appl. No.: 13/868,034

(22) Filed: Apr. 22, 2013

(65) Prior Publication Data

US 2013/0278151 A1    Oct. 24, 2013

Related U.S. Application Data

(60) Provisional application No. 61/636,570, filed on Apr. 20, 2012.

(51) Int. Cl.
*H05B 37/00* (2006.01)
*H05B 33/08* (2006.01)

(52) U.S. Cl.
CPC ........ *H05B 33/0839* (2013.01); *H05B 33/0827* (2013.01); *H05B 33/0848* (2013.01)

(58) Field of Classification Search
CPC .................................................... B23K 9/1068
USPC ......................................................... 315/164
See application file for complete search history.

(56) References Cited

U.S. PATENT DOCUMENTS

| | | | |
|---|---|---|---|
| 5,383,200 A | 1/1995 | Barrett et al. | |
| 5,745,515 A | 4/1998 | Marta et al. | |
| 6,007,218 A | 12/1999 | German et al. | |
| 6,661,820 B1 * | 12/2003 | Camilleri et al. | 372/38.09 |
| 6,922,430 B2 | 7/2005 | Biswas et al. | |
| 6,974,373 B2 | 12/2005 | Kriesel | |
| 7,087,886 B2 | 8/2006 | Almi et al. | |
| 7,232,240 B2 | 6/2007 | Kosnik et al. | |
| 7,568,802 B2 | 8/2009 | Phinney et al. | |
| 7,742,640 B1 | 6/2010 | Carlson et al. | |
| 7,787,767 B2 | 8/2010 | Wang | |
| 7,796,081 B2 | 9/2010 | Breed | |
| 7,834,302 B2 | 11/2010 | Ripingill et al. | |
| 7,911,412 B2 | 3/2011 | Benner | |
| 7,925,059 B2 | 4/2011 | Hoyos et al. | |
| 2003/0035451 A1 * | 2/2003 | Ishida et al. | 372/38.02 |
| 2006/0274918 A1 | 12/2006 | Amantea et al. | |

* cited by examiner

*Primary Examiner* — Daniel Puentes
(74) *Attorney, Agent, or Firm* — Baker & Hostetler LLP

(57) ABSTRACT

An addressable illuminator is disclosed consisting of multiple optical sources used in combination with an electrical circuit so that different combinations of the optical sources can be energized without exceeding eye-safety limits. Operation of multiple optical sources may be proximate, which is eye-safe, regardless of the number of or which ones of the optical sources are energized and regardless of the position of observers. An illuminator with multiple optical sources remains eye-safe when there are single-point electrical failures, such as short circuits, in the driving circuit. Monitoring or a feedback loop for the output power is not required or necessary to control the distance of an observer in order to be eye-safe.

25 Claims, 4 Drawing Sheets

ADDRESSABLE ILLUMINATOR WITH EYE-SAFETY CIRCUITRY

CROSS REFERENCE TO RELATED APPLICATIONS

This application claims benefit under 35 U.S.C. §119(e) of Provisional U.S. Patent Application No. 61/636,570, filed Apr. 20, 2012, the contents of which is incorporated herein by reference in its entirety.

TECHNICAL FIELD

Embodiments relate to an optical illuminator and associated circuitry to enhance eye-safety under some failure conditions. In an embodiment, an addressable illuminator consisting of multiple optical sources may be used in combination with an electrical circuit so that different combinations of the optical sources can be energized without exceeding eye-safety limits. In an embodiment, operation of multiple optical sources may be proximate, which is eye-safe, regardless of the number of or which ones of the optical sources are energized and regardless of the position of observers. In an embodiment, an illuminator with multiple optical sources remains eye-safe when there are single-point electrical failures, such as short circuits, in the driving circuit. In an embodiment, monitoring or a feedback loop for the output power may not be required, nor may it be necessary, to control the distance of an observer in order to be eye-safe. Embodiments may reduce reliance on apparatus monitoring the position or presence of observers or feedback loops for controlling output power.

BACKGROUND

A number of solutions have been proposed in the past for laser light projectors or illuminators that will protect the eye-safety of users and viewers. For example, U.S. Pat. No. 6,661,820 by Camilleri et al. (issued Dec. 9, 2003) describes controlling the output power of structured laser light projectors for maintaining eye-safety, including the use of multiple laser diodes. However, their approach provides a separately controlled laser current for each laser diode. Further, the current is controlled by a feedback system incorporating a photodetector and setting the parameters requires software running on an associated processor. Likewise, U.S. Pat. No. 7,925,059 by Hoyos et al. (issued Apr. 12, 2011) describes eye-safety considerations for an iris biometric system incorporating multiple illuminators. The patent teaches a method for determining eye-safety of controlled illuminators, but relies on software for controlling the illuminators. The patent references U.S. Patent Application Publication No. 2006/0274918 by Amantea et al. (published Dec. 7, 2006), that also relies on software running on a processor to compute eye-safe levels.

U.S. Pat. No. 6,922,430 by Biswas et al. (issued Jul. 26, 2005), entitled "Method and apparatus for a multibeam beacon laser assembly for optical communications," describes an illuminator system with a plurality of laser sources that can be independently adjusted. The eye-safety advantages of multi-beam systems are briefly mentioned. There is no mention of circuitry or electronics. U.S. Pat. No. 7,787,767 by Wang, X. (issued Aug. 31, 2010), entitled "Eye safety in electro-optical transceivers," and patents referenced in the disclosure therein describe signal loss detection circuitry to maintain eye-safety of parallel laser communication systems. These systems rely on monitoring of the output power or received power of one or more of the laser sources.

Additional apparently less relevant patents include U.S. Pat. No. 7,796,081 by Breed (issued Sep. 14, 2010), entitled "Combined imaging and distance monitoring for vehicular applications;" U.S. Pat. No. 7,742,640 by Carlson et al. (issued Jun. 22, 2010), entitled "Reduction of background clutter in structured lighting systems;" U.S. Pat. No. 7,568,802 by Phinney et al. (issued Aug. 4, 2009), entitled "Eye-safe near infra-red imaging illumination method and system;" U.S. Pat. No. 7,232,240 by Kosnik et al. (issued Jun. 19, 2007), entitled "Extended source laser illuminator;" U.S. Pat. No. 6,974,373 by Kriesel (issued Dec. 13, 2005), entitled "Apparatus and methods for the volumetric and dimensional measurement of livestock;" U.S. Pat. No. 6,007,218 by German et al. (issued Dec. 28, 1999), entitled "Self-contained laser illuminator module;" U.S. Pat. No. 5,383,200 by Barrett et al. (issued Jan. 17, 1995), entitled "Eye safe laser imaging system;" U.S. Pat. No. 5,745,515 by Marta and Morgan, (issued Apr. 28, 1980), entitled "Self-limiting intrinsically eye-safe laser utilizing an increasing absorption layer;" U.S. Pat. No. 7,834,302 by Ripingill et al. (issued Nov. 16, 2010), entitled "Eye safety protection from high power laser light;" U.S. Pat. No. 7,911,412 by Benner, Jr. et al. (issued Mar. 22, 2011), entitled "Audience scanning light projector and associated methods;" and U.S. Pat. No. 7,087,886 by Almi et al, (issued Aug. 8, 2006), entitled "Method and a system for multi-pixel ranging of a scene."

BRIEF DESCRIPTION OF THE DRAWINGS

Non-limiting and non-exhaustive examples will be described with reference to the following figures, wherein like reference numerals refer to like parts throughout the various figures.

DETAILED DESCRIPTION OF ILLUSTRATIVE EMBODIMENTS

Figure 1:
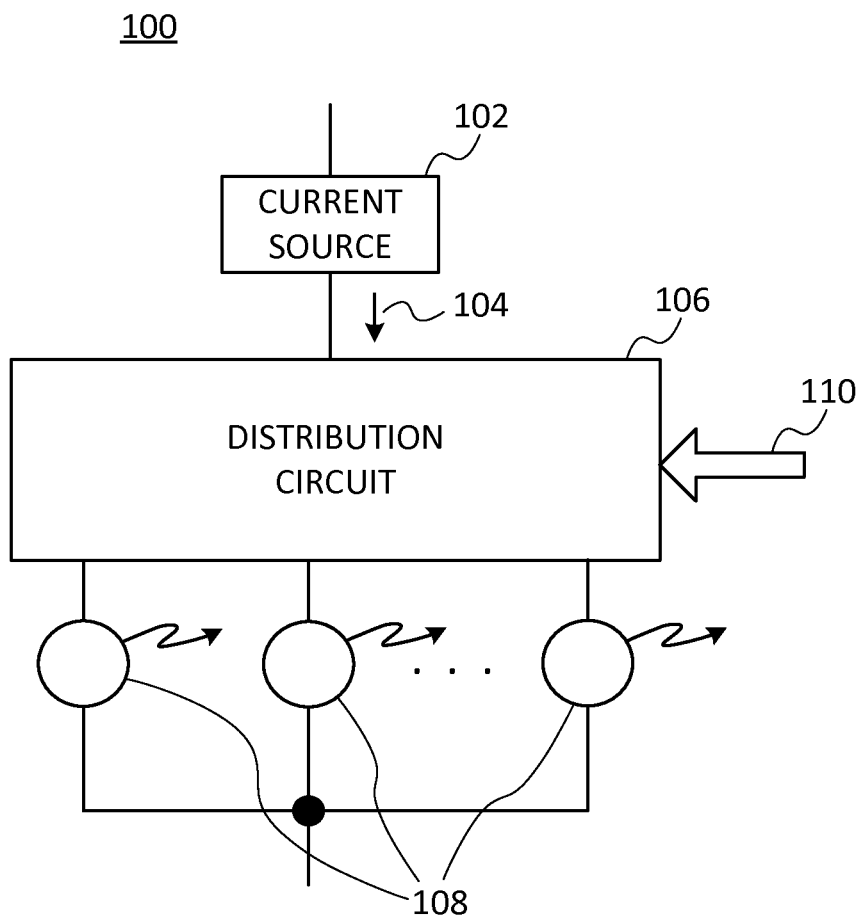
FIG. 1 is a block diagram of an embodiment of an exemplary system for improving eye-safety of an illuminator with multiple optical sources.

An illuminator may consist of multiple optical sources with some of the optical sources creating illuminated areas or patterns that differ from other optical sources. For example, an illuminator with four optical sources might be constructed so that each optical source might illuminate an area that is predominately within one quadrant of an overall illuminated region. There may be some region of overlap between illuminated areas to avoid gaps in illumination. More than one optical source may illuminate roughly the same optical area in order to provide some level of redundancy.

It may be beneficial to only illuminate a portion of an overall area in order to provide high levels of illumination intensity, where intensity is the optical power per unit solid-angle, while not exceeding an eye-safety limit such as the maximum permissible exposure of an animal, including a human, whose pupil is close to the illuminator. High levels of illumination intensity, whether in the visible spectrum or outside it, may be beneficial for obtaining better images from cameras or imaging devices including photosensor or photodiode arrays, CMOS imagers, and charge coupled devices (CCDs). For example, high levels of illumination may increase the signal-to-noise ratio of an electronic image, allowing more accurate extraction of information from the image or allowing more pixels to be used in an imaging device to provide better resolution. High levels of illumination may also allow better imaging of objects that have low reflectivity or low scatter so that less of the illumination power incident on the object is returned to the camera or imager. If a large area or wide angle is illuminated at high intensities, the total emitted power may become large. Because the illumination is frequently emitted from an area that is smaller than the area being illuminated, animal pupils that are closer to the illuminator will have higher irradiance or receive higher total power than equivalently sized pupils that are farther from the illuminator. In order to maintain the irradiance close to the illuminator at or under eye-safety limits and simultaneously provide high intensity illumination, that is a high power per unit solid-angle, it may be desirable to only illuminate a narrow field of view, that is a small solid-angle, at any one time.

Arrays or various arrangements of multiple optical sources can be beneficial for it ating large fields of view using combinations of narrower field of view optical illumination patterns. For example, an illuminator may consist of six optical sources arranged in a 2×3 array placed about one focal length from a collimation lens or other optical apparatus that reduces the divergence angle from the multiple optical sources. For purposes of higher efficiency, it may be preferred that the collimation lens or optical system collect much of the power emitted from the optical sources. As an example, the collimation lens might serve to reduce the divergence of each of the optical sources from perhaps 40 degrees full-width to 18 degrees full-width by placing the collimation lens somewhat closer to the optical sources than one focal length. Each of one of the six optical sources could then illuminate a field of view of approximately 18 degrees by 18 degrees which corresponds to approximately 0.31 radians by 0.31 radians or a solid-angle of about 0.1 steradians. The central axis of the optical beam from each source is roughly determined by a line from each source through the center of the collimation lens. Continuing with this example, if the optical sources are separated such that the angles between the axis of two beams from adjacent optical sources is 16 degrees, then all six illuminators could illuminate a field of view that is about 18/2+16+18/2=34 degrees by 18/2+2×16+18/2=40 degrees or a solid angle of about 0.4 steradians. While roughly square optical beam cross-sections would help to reduce or avoid dark regions at the interstices of the beams in the above example, assuming a square Cartesian arrangement of sources, other arrangements such as hexagonal close-packed and other beam profiles such as circular or elliptical may be employed.

The above example also illustrates the possible benefit of allowing large field of and higher intensity illumination while maintaining eye safety by using multiple optical sources. For example, assume the output power of each of the optical sources conveyed through the optical system (after accounting for such parameters as peak power, pulse width, repetition rate, wavelength, and the parameters of the optical system) is 40% of the maximum permissible exposure or 0.4 MPE. Thus, the optical intensity of any one of the beams would be 0.4 MPE/0.1 steradian=4 MPE/steradian. This is a significantly higher intensity than if a similar 0.4 MPE beam was spread over the entire field-of-view of 0.4 steradian, leading to an optical intensity of only 1 MPE/steradian. However, if each of the six optical beams is emitted from approximately the same region of the illuminator, then the total optical power could reach as high as about 6×0.4 MPE=2.4 MPE for a viewer positioned very close to the emission area of the illuminator. To avoid such an unsafe condition, only one or two optical sources can be energized at the 0.4 MPE output power level at any one time, given the parameters in this example.

To obtain the wider field of view while maintaining eye-safety, the optical sources in this example would need to be switched on and off in a sequence that allowed at most two of the optical sources to be on at one time. For example, if the optical sources are numbered 1 through 6, the illuminator might be used by turning on optical sources 1 and 2, then turning them off and turning on 3 and 4, and then turning those two optical sources off and finally turning on 5 and 6. The sequence could also be changed to only having on 1 and 2, then only 2 and 3, then only 3 and 4, then only 4 and 5, then only 5 and 6, and then only 6 and 1. Clearly, cycles through the illuminator combinations could be repeated. Or, the illuminators to be energized could be determined by which of the six regions in the entire field-of-view were of interest at any given time. For example, regions where the image was changing might be illuminated more often or for longer periods of time than regions where the image was largely unchanged. In one mode of use, the length of time any optical source was on would preferably be about one or more frame periods where a frame period, measured in seconds per frame, is the reciprocal of a frame rate, measured in frames per second. In another mode of use, the time any optical source would be on would be less than a frame period. For example, blur from fast motion could be reduced by reducing the on-time of an optical source, similar to stroboscopic lighting. Which optical sources are energized at any time could be controlled by a computer, microprocessor, microcontroller, or other programmable or non-programmable electronic circuit. Inputs to the controlling circuit could include images of the scene being illuminated and measurements of the total power being detected when each of the optical sources was energized.

Because turning on too many of the optical sources at nominal operating powers at the same time could exceed eye-safety limits, precautions should be taken to avoid the controller circuit specifying to turn on too many of the optical sources or to reduce the operating power of the optical sources if too many are specified. Improper controller circuit inputs could result, for example, from software errors, bugs, malicious tampering, electronic circuit failure or other anticipated or unanticipated malfunction of the electronic control apparatus. Thus, it is desirable to implement electronic or electrical energizing circuitry that is fail-safe, maintaining eye-safe combined output power levels from multiple optical sources even if control signals specify too many optical sources should be turned on.

Note that in present embodiments, the controlling circuit may determine which optical sources are energized, but it may not directly adjust the power levels of the optical sources. Rather, the electronic energizing circuit may be designed to distribute electrical current to the optical sources as detailed below so that eye-safety is maintained regardless of which optical sources the controlling circuit specifies should be energized.

Accordingly, an embodiment may maintain eye-safety independent of the number of optical sources energized by using a common energizing circuit for all of the optical sources. In particular, a shared current source circuit may be distributed to the multiple optical sources by a switching circuit that may be controlled by the controller circuit. The shared current source circuit may maintain an approximately constant total current regardless of how many optical sources are connected to the shared current source by the switching circuit. As the controller circuit signals the switching circuit to energize more optical sources, the total current may be maintained so that the current flowing to any one optical source is reduced. The total current may be set so that when it is directed to any one, but only one, of the optical sources, the resulting output power is eye-safe. Likewise, when the same total current is directed toward more than one optical source, the total output power of the multiple optical sources remains eye-safe.

Many optical sources have relatively small forward differential resistances and thus are best controlled by current sources or electrical sources with large source impedances. Further, the output power of many optical sources, such as LEDs, is roughly proportional to the current flowing through the optical source, $P=\eta I$, where $\eta$ is the electrical-to-optical conversion efficiency of the optical source. For other optical sources, such as laser diodes, the output power is roughly proportional to the amount of current flowing through the optical source, less a threshold current, $P=\eta(I-I_{th})$, where $I_{th}$ is the threshold current of the optical source. Thus, controlling the current through such optical sources is preferable to controlling the voltage across them.

In an embodiment, consider a current source circuit that maintains a roughly constant DC total current of $I=1$ A. This total current may be directed into a distribution circuit that may consist of ten MOSFETs with the source terminals of each MOSFET connected to the anode terminal of one of ten nominally similar LEDs. In other embodiments, more than one LED may be connected to one or more of the MOSFET source terminals. The drain terminals of all of the MOSFETs may be connected to a single circuit node, which may also be connected to the output of the current source circuit. The cathode terminals of all of the LEDs may be connected to a single circuit node such as the ground node. And a power supply, which may be a voltage source, may be connected between the common LED cathode node and the input to the current source circuit. The gates of the MOSFETs may be connected to a controller circuit that sends a digital signal that either turns the MOSFETs on into a low-resistance condition or turns the MOSFETs off into a high-resistance condition. Each MOSFET may be regarded as single-pole single-throw switch that may be controlled by the controller circuit. The controller circuit may employ one or more decoder circuits to reduce the number of signals required to control the MOSFET switches. The number of MOSFETs and the number of LEDs may be different, and each may be any number greater than one although the number of 10 will be used in this example.

Thus, the embodiment described above may distribute the total current of approximately 1 A to between zero and ten of the LEDs depending on which MOSFETs are switched on. The electrical-to-optical conversion efficiency of each of the LEDs is assumed to be $\eta=0.1$ W/A for purposes of this example. If one of the MOSFETs is switched on while the other MOSFETs are off, almost the entire total current of approximately 1 A will flow through the one LED in series with the one MOSFET resulting in an output power of $P=0.1$ W. This power shall be assumed to be eye-safe in this example based on the optical system used to manipulate the divergence, size and coherence of the optical beam. If two MOSFETs are turned on while the other eight MOSFETs remain off, the total current will be approximately divided in two so that approximately 0.5 A flows to the LED connected to the first switched on MOSFET and approximately 0.5 A flows to the LED connected to the second switched on MOSFET. The output power of each LED will be approximately 0.05 W so that the total power from all the LEDs is 0.1 W, which should be eye-safe. If all ten MOSFETs are switched on, each LED will receive approximately 0.1 A of current, producing approximately 0.01 W of power from each LED, once again giving a total output power from all of the LEDs of 0.1 W, which should be eye-safe. This example illustrates that the output power of the multiple optical source illuminator would remain eye-safe regardless of how many LEDs were energized.

If no MOSFETs are switched on, and the MOSFETs are appropriately chosen to have a high enough breakdown voltage, then a negligible amount of current will flow Gut of the current source circuit. If this creates an undesirable condition in the current source circuit, then a large shunt resistor, with a resistance higher than the on resistance of the MOSFETs, but lower than their off resistance, may be connected between the current source and the common cathode node which may be ground. Alternatively, one of the MOSFETs may be replaced with a resistor that has a resistance value intermediate between the on and off resistance of the MOSFET switch, while choosing the resistor value small enough to allow the current source circuit to operate in a desirable condition. The desirable condition of the current source circuit may include the ability to provide a stable increase in current to the desired total current level when the number of energized or switched on LEDs changes from zero to some number greater than zero. Other methods known to those of ordinary skill in the art may be employed for stabilizing current sources or otherwise enhancing their performance when they are connected to high-impedance loads that might cause the voltage drop across the high impedance load to approach or exceed the compliance voltage of the current source circuit or the power supply voltage.

The term "current source", as used herein, refers to an electrical power source that primarily controls current or that has a large source impedance. The term "current source circuit", as used herein, refers to one or more current sources connected in series or parallel. If current sources are placed in series, it may be desirable to place a shunt resistor across one or more of the current sources to allow the series current sources to operate in a well-controlled regime or other stable condition. In such a case, that such a shunt resistor is required across one or more of the current sources, the shunt resistance should be less than the source impedance of the current source but larger than the optical source differential impedance and the switch on resistance.

The design of current sources and current source circuits may include a variety of methods known to analog circuit designers. For example, they may include cascade configurations to enhance output impedance. They may employ current mirrors in various ratios and use of current reference circuits that compensate for variations in power supply voltages or temperature. Standard electrical engineering and circuit design textbooks, such as Sedra and Smith's Microelectronic Circuits (Oxford) or Horowitz and Hill's Art of Electronics, which are incorporated herein by reference, provide information on the design and use of current source circuits and the design and use of electronic switches and transistors. A variety of electrical or electronic components may be used as switches that can be controlled by other electronic signals. For example, relays, MOSFETs, JFETs, bipolar transistors, thyristors, silicon-controlled rectifiers, insulated gate bipolar transistors, solid-state relays and similar electronic devices may be used as switches. Further, circuit designers will understand that LEDs may be connected in series with switches using multiple configurations. The LEDs may be either common cathode, common anode or have independent anodes and cathodes. If the LEDs have common anodes, they may be connected between the current source and the MOSFETs or other electronic switches. The LEDs with common cathodes may also be connected between switches in series with each LED and a current source circuit that acts as a current sink.

Optical sources may have different maximum power capabilities due to, for example, having different sizes. If optical sources have different electrical-to-optical conversion efficiencies, then the most efficient optical source operating at its most efficient optical output power that is less than or equal to the eye-safe limit that may be used to determine the total current that is appropriate for eye-safety. Electrical-to-optical conversion efficiency is defined as the optical output power divided by the electrical current passing through the optical source that generates that optical output power.

Optical sources that are energized by one switch may be connected in series. Series connected optical sources will have a higher aggregate electrical-to-optical conversion efficiency than individual constituent optical sources. If series connected optical sources are used in an illuminator, the aggregate electrical-to-optical conversion efficiency of series connected optical sources may be considered. For example, if individual LEDs have an electrical-to-optical conversion efficiency of 0.1 W/A, a series connection of three such LEDs will have a combined electrical-to-optical conversion efficiency of 0.3 W/A. The highest electrical-to-optical conversion efficiency of any optical source combination that is energized by any single switch may be used to determine the total current for eye-safety.

The function relating output power to current may be nominally similar for all of the optical sources in the illuminator or it may differ from optical source to optical source.

As an example for determining the total current, assume that an illuminator is constructed from three laser diodes. Assume the first laser diode has a threshold current of $Ith1=100$ mA and a slope efficiency of $\eta 1=1$ W/A. Assume the second laser diode has a threshold current of $Ith2=200$ mA and a slope efficiency of $\eta 2=0.5$ W/A. Assume the third laser diode is identical to the second laser diode with a threshold current of $Ith3=200$ mA and a slope efficiency of $\eta 3=0.5$ W/A. For the sake of example, assume that the maximum eye-safe power is $PES=2$ W based on the optical system that has been designed to, for example, spread the optical beam, decrease its spatial coherence using a holographic or ground glass diffuser, and to change the beam's divergence angle. Using the first laser diode alone requires a current of $I=PES/\eta 1+Ith1=(2 W)/(1 W/A)+100$ mA$=2.1$ A. Using the second or third laser diodes alone require a current of $I=PES/\eta 2+Ith2=(2 W)/(0.5 W/A)+200$ mA$=4.2$ A. So the effective electrical-to-optical conversion efficiency of the first laser diode, $(2 W)/(2.1 A)=0.95$ W/A, is higher than that of the second or third laser diode. Thus, the first laser diode is used to determine the total current, $Itot=2.1A$, that allows any combination of the optical sources to remain at or below the eye-safe level. For example, if all of the laser diodes were operated simultaneously and assuming that the first laser diode drew a current of $I1=1$ A and the other two laser diodes split the remaining current to each get $I2=I3=0.55$ A each so that $Itot=I1+I2+I3$, then the total output power would be $$\begin{aligned} Ptot &= \eta 1(I1 - Ith1) + \eta 2(I2 - Ith2) + \eta 3(I3 - Ith3) \\ &= (1\ W/A)(1\ A - 100\ mA) + \\ &\quad (0.5\ W/A)(0.55\ A - 200\ mA) + (0.5\ W/A)(0.55\ A - 200\ mA) \\ &= 0.9\ W + 0.175\ W + 0.175\ W \\ &= 1.25\ W \end{aligned}$$

Since this total optical output power is less than the maximum eye-safe power of $PES=2$ W assumed for this example, the output power would remain eye-safe.

Because laser diodes with a threshold current exhibit a super-linear behavior, that is an output power vs. current curve that at least at some points exhibits a positive second-derivative, $d2P/dI2>0$, splitting the total current among multiple optical sources reduces the total output power. Note that the super-linear behavior of laser diodes assumes that they are not driven to a current greater than the point of their maximum electrical-to-optical conversion efficiency. The normal operating range for a laser diode would typically be below this current or output power level. LEDs that are not driven too hard typically exhibit an approximately linear output power vs. current relationship so that splitting a fixed total current among multiple LEDs would result in approximately the same output power as driving one LED with the same total current, again providing safe operation by avoiding a situation where multiple energized LEDs produce more optical power than a single LED.

Safety is also obtained in the case of approximately linear or supra-linear functions of output power vs. drive current within the typical operating range of the optical sources.

Switches used in embodiments may be mechanical, electromechanical, relays, micro-electro-mechanical, solid-state, pass transistors, insulated gate thyristors, vacuum tubes or similar mechanical, semiconductor, or hybrid devices. Switches may be electronically controlled. For example, a digitally-addressable multiplexer or demultiplexer integrated circuit may be used to implement a portion or all of the switching circuitry herein.

Switching circuitry may contain other components in addition to the primary switching element. For example, switches may incorporate diodes or other protection elements including ones that prevent developing large voltages across switches when they open due to lead or other inductances. Switches may include damping elements such as resistors to dissipate transient power.

The term "combined current source," as used herein, refers to total current of combined current sources, which may be zero if the switches are configured so that no optical sources are connected.

The series combination of current sources may add a large resistance or other impedance in parallel with one or more of the current sources to accommodate for small differences in the operating current of each current source.

A series connection of two or more circuit elements is defined as a circuit configuration that requires nearly the same current to flow through series connected elements, whether or not the circuit elements are directly connected or two elements each have a terminal connected to a common wire or electrical conductor. Examples of circuit elements include current sources, switches, diodes, light-emitting diodes, laser diodes, transistors, and electrically energized optical sources.

MOSFET transistors, insulated gate thyristors and solid-state relays that have minimal current flow through control terminals or gates are considered to be connected in series with another circuit element if the other circuit element is connected to one of the main primary current-carrying terminals of the relay, thyristor or transistor such as the source or drain terminal of a MOSFET.

Separations between current sources may be used to decrease the probability of shorting more than one current source at a time due to loose metallic pieces such as screws or manufacturing defects such as shorted printed-circuit board traces.

The combined current source may be pulsed or relatively constant. Current and output power may refer to peak values or average values. Averages may be determined over long periods of time or over many pulses or over the duration of a single pulse. Engineering safety factors may be included to account for manufacturing tolerances, variations in environmental conditions, or aging of components. The current of the current source may be temporarily reduced or otherwise varied during the startup and shutdown of the system including entering and leaving standby modes.

In embodiments, it may be desirable to add a high-impedance load with finite resistance in parallel with the multiplexing circuit or in parallel with the multiplexing circuit and optical sources if operation of the current source into an open circuit results in undesired performance of the current source such as instability or slower adjustment Eye-safety generally requires that the optical power or pulse energy that can enter the fully dilated pupil of a viewer be equal to or less than a value established by eye--safety standards. The maximum eye-safe power or pulse energy is a function of a number of parameters as discussed in eye-safety standards. Examples of eye-safety standards include ANSI Z136.1 and IEC 60825, which are incorporated herein by reference. Whether an illumination source is considered to be "eye-safe" is determined by governmental regulation, standards committees, medical studies, consumer groups, or other sources with legal, industry, or popular authority to determine safe optical power levels, any may change from jurisdiction to jurisdiction, as well as over time as new information becomes available. Regardless of what is currently considered to be "eye-safe" or is considered to be "eye-safe" in the future, present embodiments can result in an eye-safe illuminator. While eye-safety is one criteria for determining the total current, other criteria may be total power dissipation, thermal management, reliable operation of electronic components, maximum current capability of electrical conductors or devices, or other engineering limitations.

Eye--safety may include consideration of the total output power, the power distribution among emitted wavelengths, the spatial extent of the optical source, and the coherence of the optical source. Determination of eye-safe powers may include consideration of the wavelengths emitted by the optical source and the properties of the optical beam accessible to a viewer. Such optical beam properties may include the divergence angle, the diameter of the beam, the total power of the beam, the distribution of power within the beam, the pulse shape, the pulse duration, the repetition rate, the exposure duration, the pulse peak power, the pulse average power, and the spatial or temporal coherence of the beam. Methods for determining eye-safe powers or other limits from these parameters are discussed in applicable eye-safety standards or regulations such as those issued by governmental agencies including CDRH or NIH or technical standards committees including ANSI and IEC and documents referenced directly or indirectly by these standards or regulations, including EN 207 specified by the European Community or ANSI 2136.1 specified in the United States. Eye-safe powers or other limitations may also be determined by consumer protection groups or from scientific studies or methods that these or similar groups publicize.

The term "optical source," as used herein, refers to a device that emits electro-magnetic radiation and is electrically energized and whose output power is a function of the electrical current passing through the device. The term "optical source" is used herein even though the electro--magnetic radiation may be outside the visible spectrum. Thus, an optical source may emit visible, infrared, ultraviolet, terahertz, microwave or radio-frequency radiation. The emitted radiation may be a direct consequence of current flowing through the device, or the device may involve multiple steps in converting the electrical energy into the emitted radiation. For example, a phosphor coated LED is one type of optical source wherein an electrical current through the LED excites the emission of photons and energies near those of the bandgap of the LED and a portion or all of those directly generated photons may impinge on a phosphor coating to generate other photons that may be at a different wavelength. Other examples of optical sources include LEDs, laser diodes, gas lasers, other forms of lasers, arc lamps, incandescent lamps, halogen lamps, and fluorescent lamps.

Multiple optical sources may be monolithically integrated on a single substrate, such as a semiconductor wafer, or some or all optical sources may be implemented on separate substrates or in separate electronic component packages.

Multiple devices, each of which may be separately considered to be an optical source, may be combined to create composite optical sources. The devices may be combined in various circuit topologies including parallel and series, and multiple levels of combinations of these circuit topologies such as series-parallel and parallel-series. In an embodiment, the circuit topologies of devices in optical sources may result in only two terminals that can be electrically connected to other circuit components, elements or modules, such as current sources, switches or resistors.

With reference now to the drawing, a detailed description of the various figures will be provided, FIG. 1 illustrates a block diagram exemplifying an embodiment of an optical illuminator 100. A current source circuit 102 sources a total current 104 into a distribution circuit 106 that divides total current 104 among the multiple optical sources 108. Control signals 110 control how the total current 104 is divided among the multiple optical sources 108 and, thus, which optical sources 108 are energized. The sum of all of the currents through individual optical sources 108 is approximately equal to the total current 104.

Figure 2:
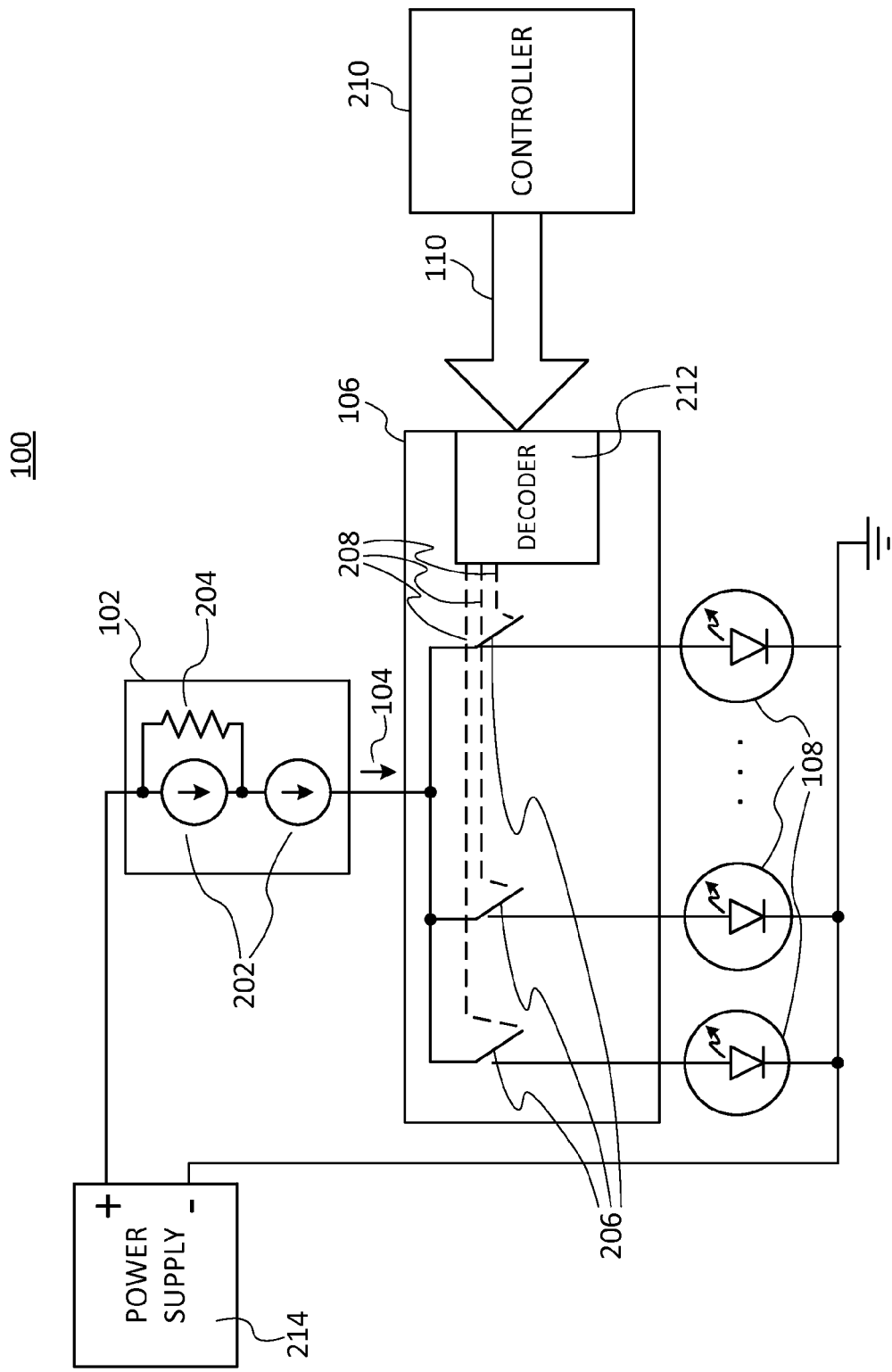
FIG. 2 is a schematic circuit diagram of an embodiment of an exemplary system for improving eye-safety explicitly showing switches and series current sources.

A more detailed embodiment of the optical illuminator 100 is provided in FIG. 2, where the current source circuit 102 comprises at least two series connected current sources 202. Use of multiple series connected current sources 202 provides redundant protection in case one of the current sources 202 is shorted. Shorts in one current source 202, for example, may be due to manufacturing defects in the associated components or traces connected to the current source 202 on a printed circuit board. Placing the two or more series connected current sources 202 in separate physical locations in separate packages may further reduce the probability that a manufacturing defect or loose metallic conductor, such as a screw, could simultaneously short out all of the current sources 202.

Because of manufacturing tolerances on components for current sources 202, the current of the various current sources 202 may not be identical in the desired operating voltage range of the current sources 202. Thus, a shunt resistor 204 with lower impedance than the output impedance of the current sources 202 may be added in parallel with all but one of the current sources 202 to allow operation at the same current while maintaining operation in a desirable voltage range. In this embodiment, the total current 104 is approximately identical to the current of each series connected current source 202 in the current source circuit 102. Again, the total current 104 is divided among zero or more of the multiple optical sources 108 which may be, for example, light-emitting diodes (LEDs), by the distribution circuit 106. In this case, the distribution circuit 106 consists of switches 206 in series with each optical source 108 where each switch is opened or closed by a switch control signal 208 that is derived from the control signals 110 provided by a controller circuit 210.

An optional decoder circuit 212 may translate control signals 110 into switch control signals 208. For example, if the distribution circuit 106 is designed to operate as a demultiplexer (or multiplexer depending on perspective) then the control signals 110 may be an address of the switch 206 to close. The embodiment of FIG. 2 also shows that the power supply 214, for example, may deliver an approximately fixed voltage across the combined current source circuit 102, distribution circuit 106, and optical sources 108.

Figure 3:
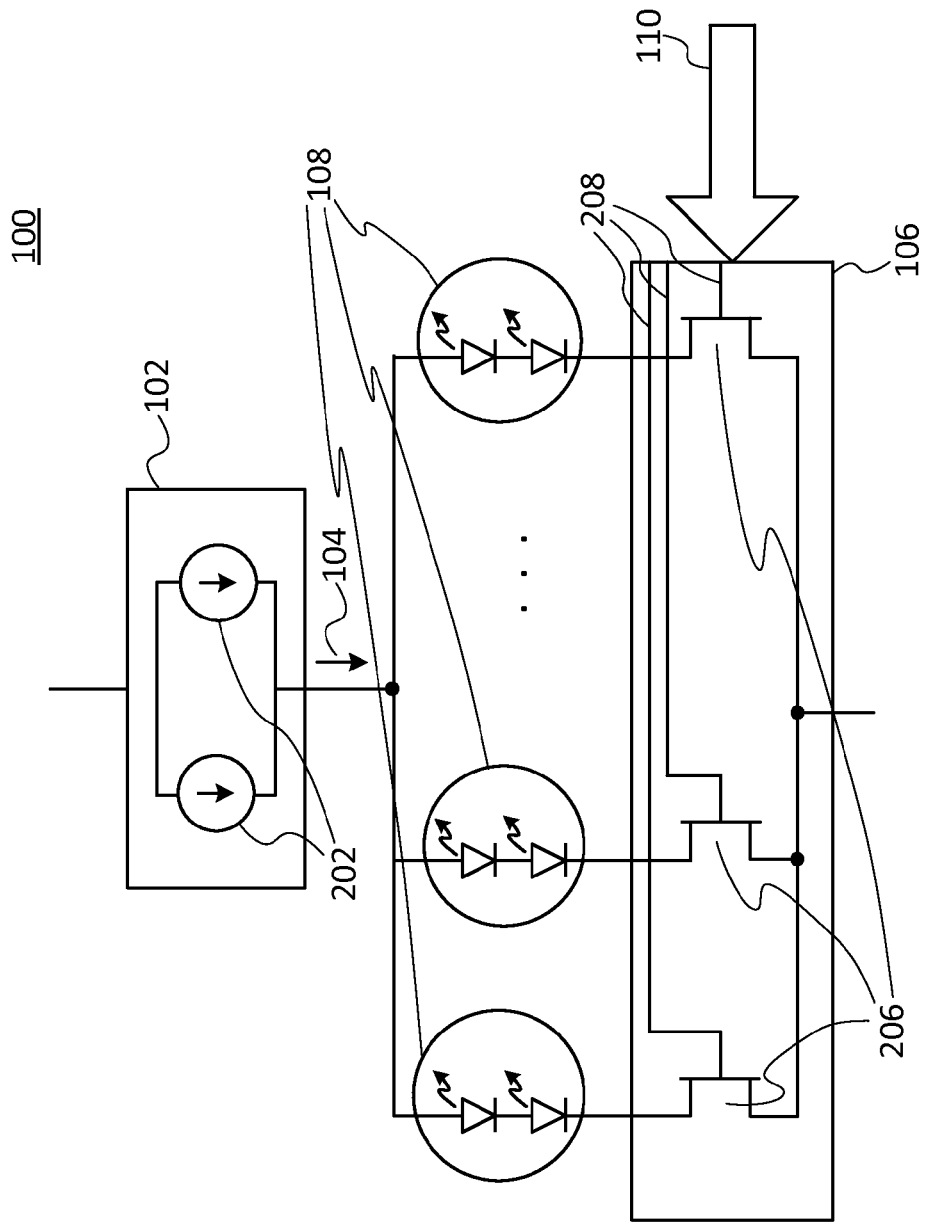
FIG. 3 is a schematic circuit diagram of an embodiment of an exemplary system for improving eye safety explicitly showing series connected LEDs in each optical source, parallel current sources in the current source circuit and MOSFETs used as switches.

FIG. 3 illustrates another embodiment of optical illuminator 100 that illustrates additional options and arrangements of the components. In this case, the current source circuit 102 may consist of two parallel current sources 202 as might be done if a single current source 202 did not have sufficient current capacity. The total current 104 in this case is the sum of the currents from the two parallel current sources 202. The total current 104 may be applied to multiple parallel circuit branches where each nominally identical circuit branch consists of a series combination of an optical source 108 and a MOSFET switch 206. In this embodiment, each optical source 108 comprises a series connection of two LEDs. Each MOSFET switch 206 may be controlled by a switch control signal 208 that may be applied to the gate of the MOSFET based on control signals 110.

As noted, the switch control signals 208 come from the control signals 110, and may be implemented so that the voltages of the switch control signals 208 applied to the gates of the MOSFET switches 206 properly bias the MOSFETs into either a low-resistance on state or a high-resistance off state. Should the control signal 110 improperly close too many MOSFET switches 206 (i.e., put them in a low-resistance state), the total output power of the energized optical sources 108 will remain about the same as the output power produced, if only one of the MOSFET switches 206 was closed energizing only one optical source 108. The total output power remains about the same independent of the number of energized optical sources 108 because the total current 104 remains the same regardless of how many MOSFET switches 206 are closed. If the total current 104 is designed to produce an eye-safe output power, the output power will remain eye-safe regardless of how many MOSFET switches 206 are closed, even if the control signal 110 erroneously closes more than the desired number of MOSFET switches 206.

Figure 4:
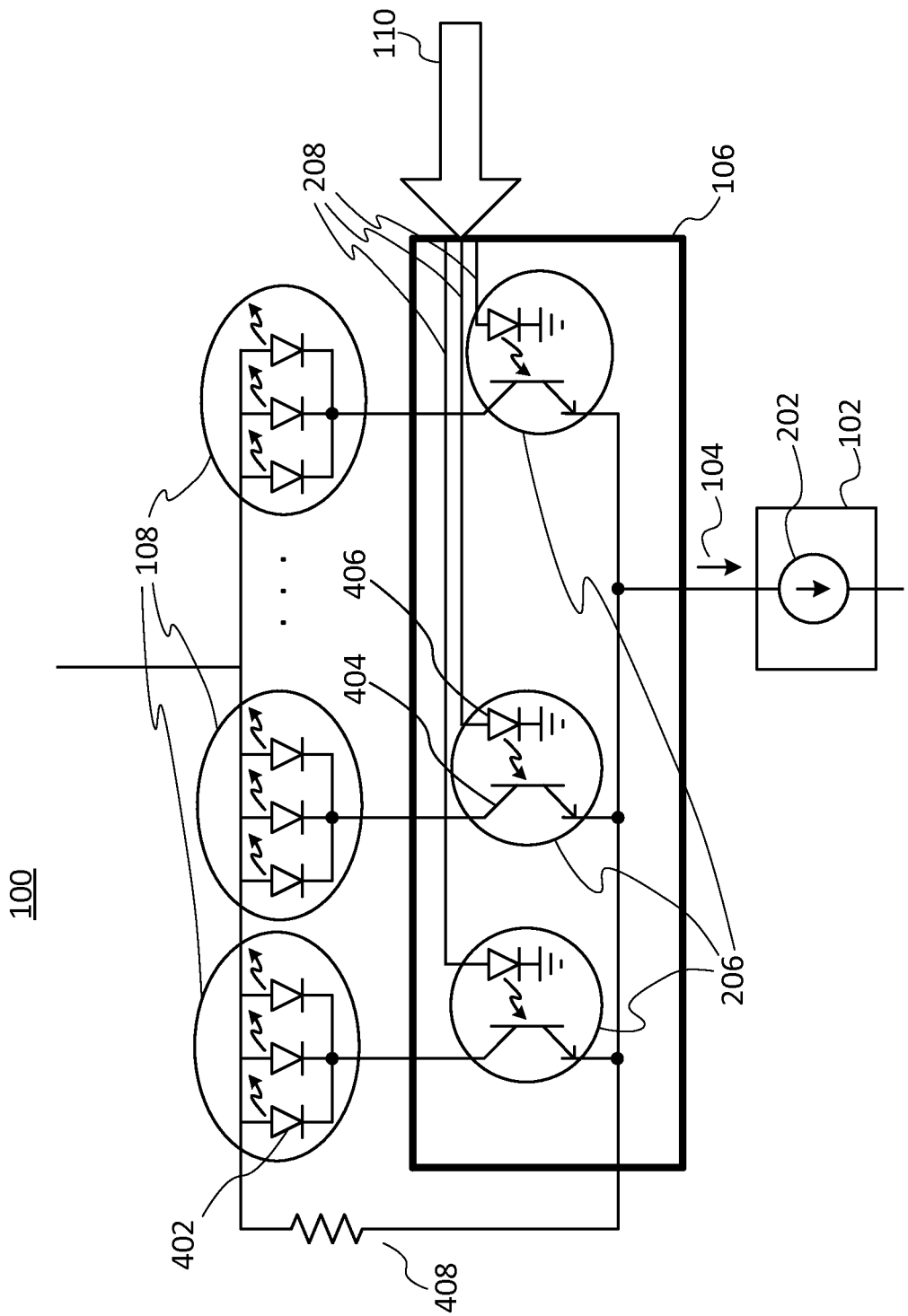
FIG. 4 is a schematic diagram of an embodiment of an exemplary system for improving eye-safety explicitly showing a common anode laser diode array with parallel groups of three laser diodes in each optical source, phototransistors for switches and a bypass resistor to keep the total current from dropping to near zero when no optical sources are energize.

FIG. 4 illustrates another embodiment of optical illuminator 100 that provides a distribution circuit 106 between the current source circuits 102 and the optical sources 108. As shown, the current source 102 is sinking current out of the distribution circuit 106. More options for the optical sources 108 and the switches 206 are also shown. Here, each optical source 108 may consist of three parallel laser diodes 402 (illustrated with the same schematic symbol as used for LEDs herein). The laser diodes 402 as shown in this example all share a common anode as could be the case for an array of laser diodes 402 fabricated on a common p-type doped substrate. Metallization patterned on a monolithic array may be used to define groups of parallel laser diodes 402 by connecting together the cathodes within each group that may then be used as a single optical source 108. FIG. 4 also shows that the switches 206 may be comprised of phototransistors 404 where the switch control signals 208 drive LEDs 406 that illuminate the base of the corresponding bipolar phototransistor 404 to place it in a highly conducting state, equivalent to closing the corresponding switch 206.

It may be desirable to choose phototransistors 404 such that the maximum current of the phototransistor 404 when closed is appreciably greater than the total current 104 so that each phototransistor 404 simply acts as a low on-resistance switch. A final feature of this embodiment is the bypass resistor 408 which may serve to provide a path for the total current 104 should none of the phototransistor-based switches 206 be closed. While it may be practical to allow the total current 104 to significantly decrease when none of the switches 206 are closed, it may also be beneficial to allow the normal total current 104 or a partially diminished amount of total current 104 to flow through the current source circuit 102 in order to maintain the stability of the circuit.

The resistance of an optional bypass resistor 408 may be chosen to create a voltage drop across that resistor that may be significantly higher than the voltage drop across the series combination of an optical source 108 and a switch 206 when the switch 206 was closed. This would prevent the bypass resistor from removing any significant amount of current from the optical sources 108 when one or more of the optical sources 108 was energized. The bypass resistor 408 could also be replaced by a resistor in series with a diode or multiple series connected diodes to further reduce the current flowing through the bypass path when one or more of the switches 206 were closed.

The methodologies described herein may be implemented by various methods, depending upon applications according to particular examples. For example, such methodologies may be implemented in hardware, firmware, software, or combinations thereof. In a hardware implementation, for example, a processing unit may be implemented within one or more application specific integrated circuits ("ASICs"), digital signal processors ("DSPs"), digital signal processing devices ("DSPDs"), programmable logic devices ("PLDs"), field programmable gate arrays ("FPGAs"), processors, controllers, micro-controllers, microprocessors, electronic devices, other devices units designed to perform the functions described herein, or combinations thereof.

Some portions of the detailed description included herein may be presented in terms of algorithms or symbolic representations of operations on binary digital signals stored within a memory of a specific apparatus or special purpose computing device or platform. In the context of this particular specification, the term specific apparatus or the like includes a general purpose computer once it is programmed to perform particular operations pursuant to instructions from program software. Algorithmic descriptions or symbolic representations are examples of techniques used by those of ordinary skill in the signal processing or related arts to convey the substance of their work to others skilled in the art. An algorithm is here, and generally, is considered to be a self-consistent sequence of operations or similar signal processing leading to a desired result. In this context, operations or processing involve physical manipulation of physical quantities. Typically, although not necessarily, such quantities may take the form of electrical or magnetic signals capable of being stored, transferred, combined, compared or otherwise manipulated. It has proven convenient at times, principally for reasons of common usage, to refer to such signals as bits, data, values, elements, symbols, characters, terms, numbers, numerals, or the like. It should be understood, however, that all of these or similar terms are to be associated with appropriate physical quantities and are merely convenient labels. Unless specifically stated otherwise, as apparent from the discussion herein, it is appreciated that throughout this specification discussions utilizing terms such as "processing," "computing," "calculating," "determining" or the like refer to actions or processes of a specific apparatus, such as a special purpose computer or a similar special purpose electronic computing device. In the context of this specification, therefore, a special purpose computer or a similar special purpose electronic computing device is capable of manipulating or transforming signals, typically represented as physical electronic or magnetic quantities within memories, registers, or other information storage devices, transmission devices, or display devices of the special purpose computer or similar special purpose electronic computing device.

Reference throughout this specification to "one example," "an example," and/or "another example" should be considered to mean that the particular features, structures, or characteristics may be combined in one or more examples.

While there has been illustrated and described what are presently considered to be example features, it will be understood by those skilled in the art that various other modifications may be made, and equivalents may be substituted, without departing from the disclosed subject matter. Additionally, many modifications may be made to adapt a particular situation to the teachings of the disclosed subject matter without departing from the central concept described herein. Therefore, it is intended that the disclosed subject matter not be limited to the particular examples disclosed.

What is claimed:

1. An optical illuminator, comprising:
   at least two optical sources configured to be independently energized;
   a combined current source configured to deliver a shared total current, wherein the shared total current is determined by an eye-safe level of output power when only a single optical source is energized; and
   an electronic circuit including one or more switches for dividing distribution of the shared total current among zero or more of the optical sources, the electronic circuit being configured to generate an output power from a single optical source among the optical sources that is eye-safe when the shared total current is distributed to only the single optical source and to generate a combined optical power of two or more optical sources that is eye-safe when the shared total current is distributed to a combination of two or more optical sources.

2. The optical illuminator as recited in claim 1, wherein the combined current source includes a plurality of current sources connected in series or in parallel.

3. The optical illuminator as recited in claim 2, wherein the combined current source are connected in series and further include a shunt resistor across all but one of the plurality of current sources, the shunt resistor having a shunt resistance that is less than a source impedance of each current source but larger than an optical source differential impedance of each optical source and a switch on resistance of each switch.

4. The optical illuminator as recited in claim 2, wherein at least one current source among the plurality of current sources is contained in a separate electronic package from at least one other current source among the plurality of current sources.

5. The optical illuminator as recited in claim 4, wherein at least one current source among the plurality of current sources is separated by at least one centimeter from at least one other current source among the plurality of current sources.

6. The optical illuminator as recited in claim 4, wherein at least one current source among the plurality of current sources is contained within a printed-circuit board that does not include at least one other current source among the plurality of current sources.

7. The optical illuminator as recited in claim 4, wherein at least one current source among the plurality of current sources is contained within an enclosure that does not contain at least one other current source among the plurality of current sources.

8. The optical illuminator as recited in claim 1, wherein the one or more switches share a common terminal connected to the combined current source and the switches are in series with the optical sources.

9. The optical illuminator as recited in claim 1, further comprising a controller for turning on or off the one or more switches.

10. The optical illuminator as recited in claim 9, wherein the one or more switches are MOSFET switches each having a source terminal, a drain terminal and a gate terminal, wherein the at least two optical sources are LEDs each having an anode terminal and a cathode terminal, wherein for each of the MOSFET switches and the LEDS the source terminal of a single MOSFET switch is connected to the anode terminal of a single LED, wherein the drain terminal for each MOSFET switch is connected to a first node connected to an output of the combined current source, wherein the cathode terminal for each LED is connected to a second node connected to a ground, further comprising a power source connected between the second node and an input to the combined current source.

11. The optical illuminator as recited in claim 10, wherein the controller is configured to provide a control signal that causes one or more of the MOSFET switches to switch to either a low-resistance condition or a high resistance condition.

12. The optical illuminator as recited in claim 11, wherein the controller includes a decoder configured to receive the control signal and to generate an address to the gate terminal of each MOSFET switch that causes each MOSFET switch to switch to either a low-resistance condition or a high resistance condition.

13. The optical illuminator as recited in claim 10, further comprising a shunt resistor connected between the output of the combined current source and the second node, wherein the shunt resistor has a resistance higher than an on resistance of the MOSFET switches, but lower than an off resistance of the MOSFET switches.

14. The optical illuminator as recited in claim 10, wherein one MOSFET switch among the one or more MOSFET switches is replaced by a resistor with a resistance value intermediate between an on resistance of the MOSFET switches and an off resistance of the MOSFET switches, but the resistance value being small enough to allow the combined current source to operate in a desirable condition.

15. The optical illuminator as recited in claim 10, wherein the LEDs are laser diodes.

16. The optical illuminator as recited in claim 9, wherein the one or more switches are MOSFET switches each having a source terminal, a drain terminal and a gate terminal, wherein each optical source among the at least two optical sources are two or more LEDs connected in series each having an input anode terminal and an output cathode terminal, wherein each input anode terminal is connected to a first node connected to an output of the combined current source, wherein each output cathode terminal is connected to the source terminal of one MOSFET switch, wherein each drain of each MOSFET switch is connected to a second noted connected to a ground.

17. The optical illuminator as recited in claim 16, wherein the controller is configured to provide a control signal that causes one or more of the MOSFET switches to switch to either a low-resistance condition or a high resistance condition.

18. The optical illuminator as recited in claim 9, wherein each switch among the one or more switches includes a bipolar phototransistor and a drive LED that illuminates a base of the bipolar phototransistor in response to a control signal from the controller to place the bipolar phototransistor in a highly conductive state that closes the switch, and wherein a maximum current of the bipolar phototransistor when closed is appreciably greater than the shared total current.

19. An optical illuminator, comprising:
   a plurality of optical sources configured to be independently energized;
   a combined current source configured to deliver a total current to the plurality of optical sources, the total current being approximately constant regardless of any changes to the combined current source; and
   an electronic circuit including one or more switches configured to simultaneously distribute the total current to the plurality of optical sources based on at least one set of control inputs to the electronic circuit.

20. The optical illuminator as recited in claim 19, wherein the total current provided to each optical source among the plurality of optical sources remains approximately constant regardless of any appreciable current flowing through any optical sources among the plurality of optical sources, and wherein the total current is chosen so that the total current multiplied by an electrical-to-optical conversion efficiency yields an optical power of the illuminator that is eye-safe.

21. A method of operating an optical illuminator including an array of optical sources for illuminating an object, comprising:
   (a) switching on at least one optical source of the array at a time without switching on any other optical source of the array not included in the at least one optical source, wherein switching on comprises connecting the optical source to a constant current power source;
   (b) controlling a total current provided to the at least one optical source when turned on such that the total current supplied to the at least one optical source multiple multiplied by an electrical-to-optical conversion efficiency yields an optical power of the optical illuminator that is eye-safe;
   (c) turning off the at least one optical source before turning on a next at least one optical source of the array in accordance with steps (a) and (b); and
   (d) repeating steps (a)-(c) to maintain illuminator of the object.

22. The method as recited in claim 21, wherein an output power of the array without application of steps (a)-(c) would not be eye-safe.

23. The method as recited in claim 21, wherein the at least one optical source illuminates a region of the object and other optical sources of the array illuminate other regions of the object, the method further comprising switching on and turning off the at least one optical source more frequently or for a length of time longer than the other regions based on changes to the object within the region.

24. The method as recited in claim 23, wherein the length of time is for one or more frame periods.

25. The method as recited in claim 23, wherein the length of time is less than a frame period.

* * * * *